(12) United States Patent
Chan et al.

(10) Patent No.: US 6,429,692 B1
(45) Date of Patent: Aug. 6, 2002

(54) HIGH SPEED DATA SAMPLING WITH REDUCED METASTABILITY

(75) Inventors: Edwin Chan, San Jose; Kochung Lee, Sunnyvale; Ji Zhao, San Jose, all of CA (US)

(73) Assignee: Octillion Communications, Inc., San Jose, CA (US)

( * ) Notice: Subject to any disclaimer, the term of this patent is extended or adjusted under 35 U.S.C. 154(b) by 0 days.

(21) Appl. No.: 09/885,243

(22) Filed: Jun. 19, 2001

(51) Int. Cl.[7] .............................................. H03K 19/094
(52) U.S. Cl. ....................... 326/127; 326/115; 326/126; 326/93; 326/95; 326/98
(58) Field of Search .................................. 326/115, 119, 326/121, 127, 93, 95, 98

(56) References Cited

U.S. PATENT DOCUMENTS

| 5,216,295 A | * | 6/1993 | Hoang ......................... 307/451 |
| 6,028,454 A | * | 2/2000 | Elmasry et al. .............. 326/115 |
| 6,320,422 B1 | * | 11/2001 | Koh ............................ 326/115 |

* cited by examiner

Primary Examiner—Michael Tokar
Assistant Examiner—Vibol Tan
(74) Attorney, Agent, or Firm—John Schipper

(57) ABSTRACT

A data sampling system, including a data tracking circuit and a data latching circuit, that reduces the likelihood of metastability that arises through competition of the two circuits, where data sampling occurs in a transition time interval. A combined latching and weakened tracking circuit is provided in which the tracking operation cannot change an output signal from the latching operation after the latch resolves a valid logical state.

7 Claims, 5 Drawing Sheets

HIGH SPEED DATA SAMPLING WITH REDUCED METASTABILITY

FIELD OF THE INVENTION

This invention relates to sampling of data at relatively high sampling rates.

BACKGROUND OF THE INVENTION

A conventional high speed CML data sampler works in two phases: a first phase in which data are tracked, and a second phase in which the tracked data are latched. Ideally, data are sampled in the middle of these two phases. If sampling occurs at a data transition between the two phases, a latch is often unable to resolve a valid output logical state, and an undesirable condition known as metastability occurs. In a conventional approach to reducing or eliminating the occurrence of metastability, a cascade structure of latches is used to reduce, but not to zero, the probability that metastability occurs at a given sampling time. This approach is straightforward, but a small, non-zero probability of metastability remains, depending upon the sampling rate and the length of a transition interval between tracking and latching.

What is needed is an approach that reduces to substantially zero the probability that metastability occurs in data sampling. Preferably, the approach should be flexible and should allow variation of one or more parameters that affect combined tracking and latching.

SUMMARY OF THE INVENTION

These needs are met by the invention, which applies a combination of a latching operation and a weak tracking operation that defers to the latching operation when a valid logical state is (already) latched. In one embodiment, additional tracking transistors are connected to latching transistors in the latch module in order to implement weakened tracking. In another embodiment, a driving voltage or current in the tracking module is weakened to suppress competition between a tracking signal and a latching signal and to allow the latching signal to avoid metastability.

DESCRIPTION OF BEST MODES OF THE INVENTION

Figure 1:
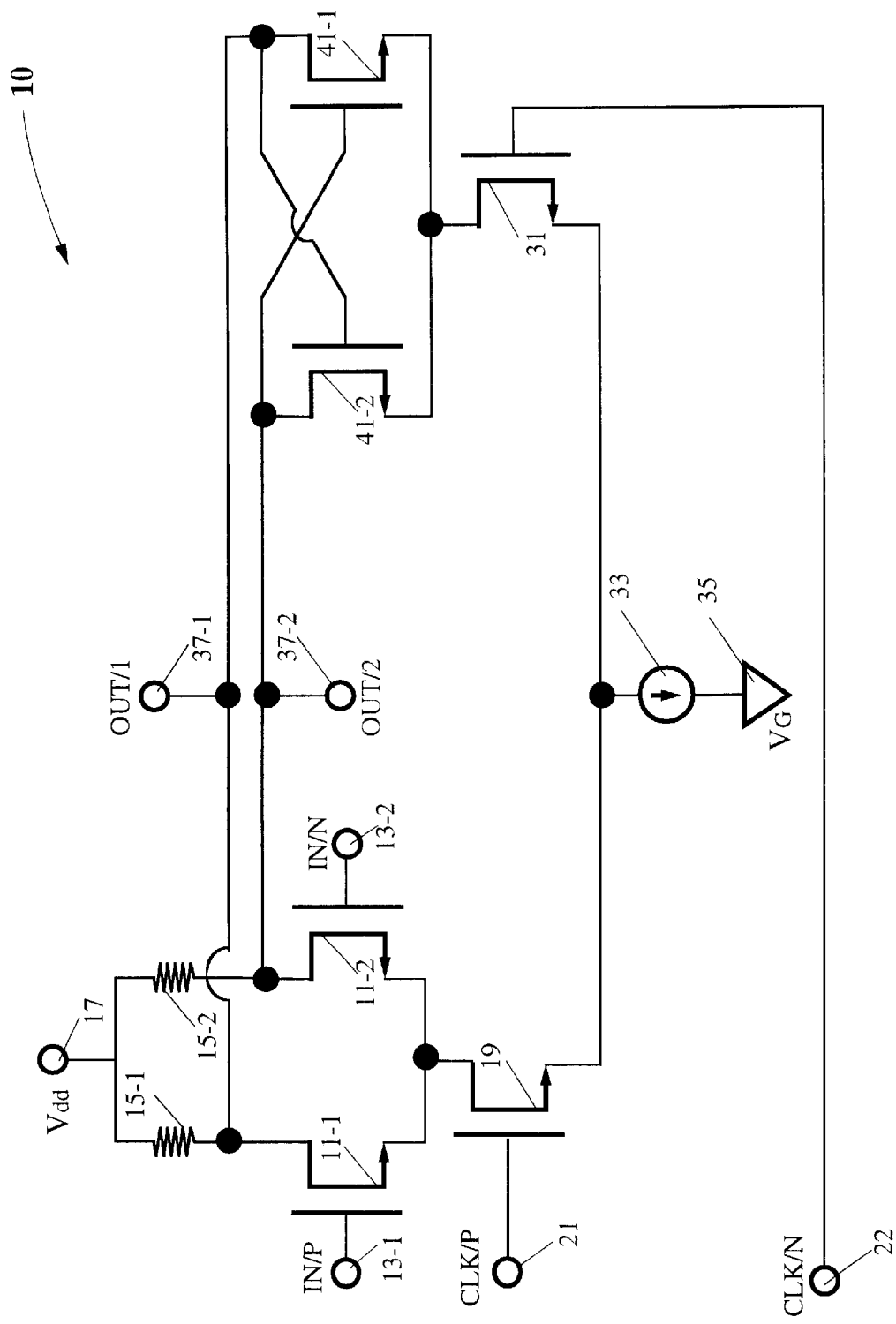
FIG. 1 schematically illustrates apparatus used for tracking and latching in the prior art.

FIG. 1 schematically illustrates conventional apparatus 10 for tracking and latching sampled data. The apparatus 10 includes first and second NMOS transistors, 11-1 and 11-2, whose gates receive respective input signals, IN/F and IN/N at first and second input terminals, 13-1 and 13-2. Drains of the first and second transistors, 11-1 and 11-2 are connected through first and second (preferably matched) resistors, 15-1 and 15-2, respectively, to a voltage source 17 that provides a selected voltage $V_{dd}$. Sources of the first and second transistors, 11-1 and 11-2, are connected to a drain of a third NMOS transistor 19, whose gate receives a first clock input signal CLK/P from a first clock input terminal 21.

A source of the third transistor 19 and a source of a fourth NMOS transistor 31 are connected through a current source 33 to a source 35 of ground voltage ($V_G$). The first, second and third transistors, 11-1, 11-2 and 19, the first and second resistors, 15-1 and 15-2, the first and second input terminals, 13-1 and 13-2 and the first clock input terminal 21 are part of a data tracking module in the device 10.

The drains of the first and second NMOS transistors, 11-1 and 11-2, are connected to drains of fifth and sixth transistors, 41-1 and 41-2, respectively, and to gates of the respective sixth and fifth transistors, as shown. Sources of the fifth and sixth transistors, 41-1 and 41-2, are connected to a drain of the fourth transistor 31. A gate of the fourth transistor 31 also receives a second clock input signal CLK/N from a second clock input terminal 22 (complementary to CLK/P).

The drain of the first transistor 11-1 is connected to the drain of the fifth transistor 41-1 and to a first output signal terminal 37-1 that provides a first output signal OUT/1. The drain of the second transistor 11-2 is connected to the drain of the sixth transistor 41-2 and to a second output signal terminal 37-2 that provides a second output signal OUT/2. The fourth, fifth and sixth transistors, 31, 41-1 and 41-2, the second clock terminal 22, and the first and second data output terminals, 37-1 and 37-2, form part of a data latching module in the device 10.

Sampled data are received ("tracked") at the data input terminals, 13-1 and 13-2, and are transferred to the data output terminals, 37-1 and 37-2, following the next clock signal transition for CLK/N received at the gate of the fourth transistor 31.

Figure 2A:
FIGS. 2A/2B/2C and 3A/3B/3C illustrate graphically some effects of data sampling, at a time spaced apart from a transition interval and at a time coinciding with a transition.
Figure 2B:
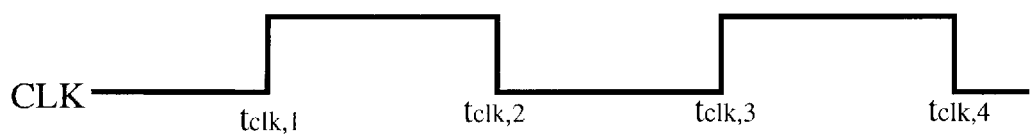
Figure 2C:

Ideally, the data are sampled at each of the data input terminals, 13-1 and 13-2, at times that are spaced apart from (rising edge) clock transition times (or, alternatively, falling edge times), $t_{CLK,1}$, $t_{CLK,3}$, etc., as in the situation illustrated in FIGS. 2A, 2B and 2C. In these Figures, the (rising edge) clock transition times occur at time points $t=t_{CLK,i}$ ($i=1, 3, \ldots$) that are well separated from data transition times. As a result of this temporal separation, an output signal OUT (=OUT/1 or OUT/2) appearing at an output terminal, 37-1 or 37-2, is stable and well defined, as indicated in FIG. 2C.

Figure 3A:
Figure 3B:
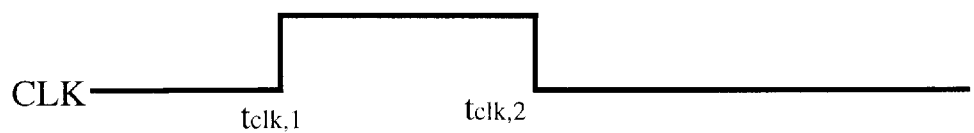
Figure 3C:
Figure 4:
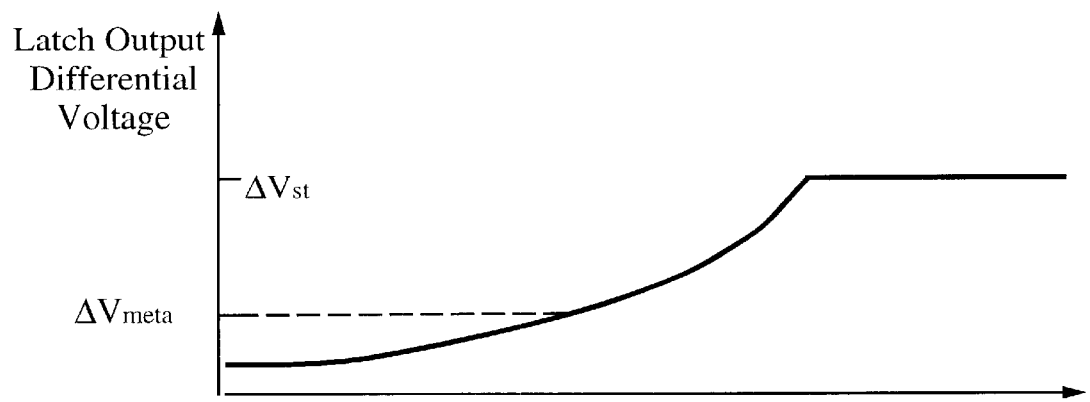
FIG. 4 illustrates graphically a range of voltage values associated with metastability and with stability.

However, the apparatus 10 shown in FIG. 1 does not provide adequate protection against approximate coincidence of a data transition time and data sampling time, which situation is illustrated in FIGS. 3A, 3B and 3C. When a clock transition time, such as $t_{CLK,1}$, falls within a small range of times corresponding to transition of a sampled data IN from a first data value to a second distinct data value, as in FIGS. 3A and 3B, the corresponding output signal value OUT may become uncertain, non-constant and not well defined, as illustrated in FIG. 3C. This unsatisfactory situation occurs, in part, because the latch output differential voltage $\Delta V_{data}$ arising from the data value transition is well defined when $\Delta V_{data} \leq \Delta V_{meta}$ but becomes increasingly ill-defined (metastable) as $\Delta V_{data}$ decreases below the (lowest) stability value $\Delta V_{meta}$, as illustrated graphically in FIG. 4. If one could ensure that the tracking operation does not force a change in data value when the latched data value is in a well defined logical state, this metastability condition may be avoided, even where a clock transition time approximately coincides with a sampled data transition time.

Figure 5:
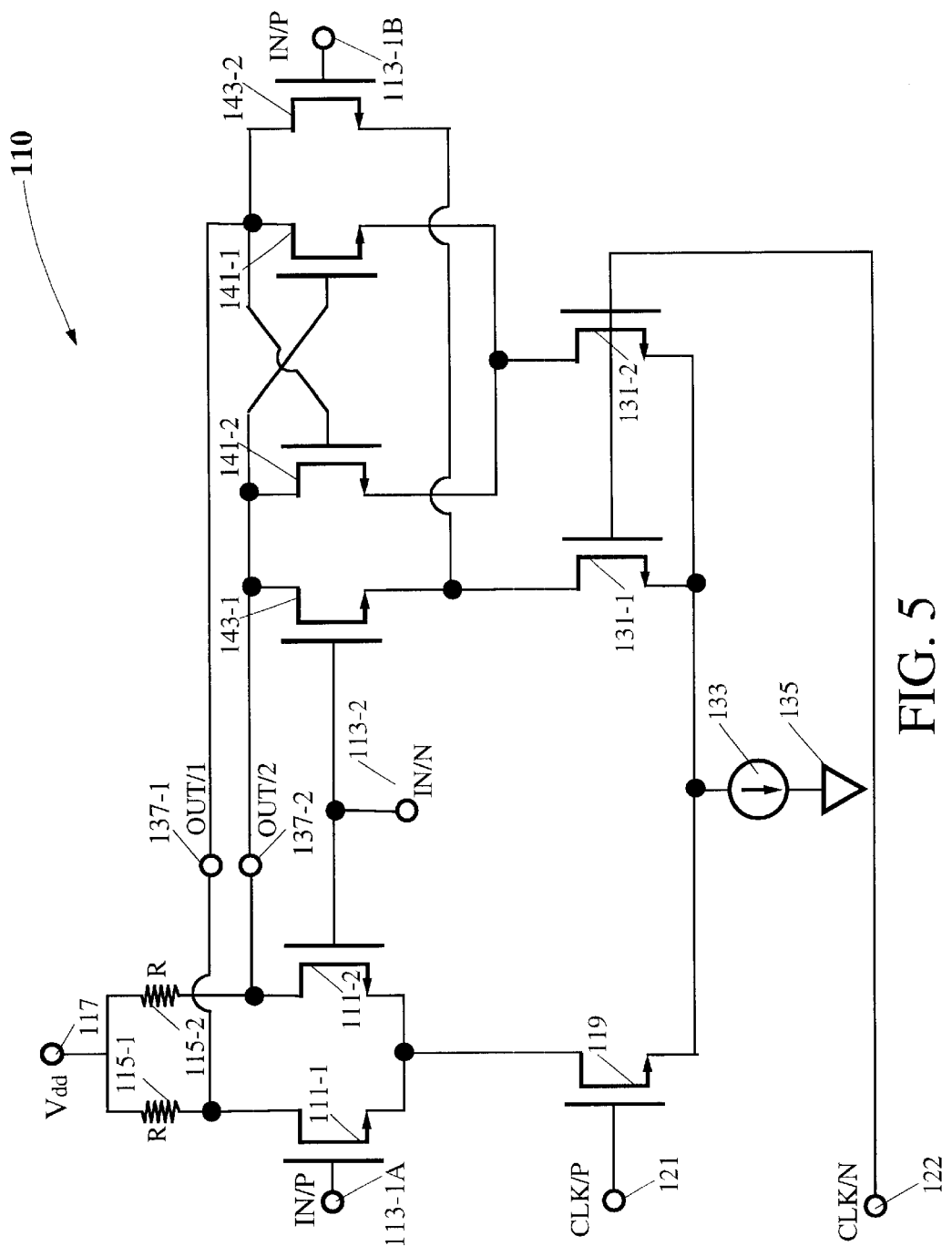
FIGS. 5 and 7 schematically illustrate two systems that implement latching and weak tracking according to the invention.

FIG. 5 illustrates a system 110, according to one embodiment of the invention, that combines latching and "weak tracking," according to which the tracking operation cannot cause a change in a latched value if the latched value is (already) stable and well defined. The apparatus 110 includes first and second NMOS transistors, 111-1 and 111-2, whose gates receive respective input signals, IN/P and IN/N at first and second input terminals, 113-1A and 113-2. Drains of the first and second transistors, 111-1 and 111-2 are connected through first and second (preferably matched) resistors, 115-1 and 115-2, respectively, to a voltage source 117 that provides a selected voltage $V_{dd}$. Sources of the first and second transistors, 111-1 and 111-2, are connected to a drain of a third NMOS transistor 119, whose gate receives a first clock input signal CLK/P from a first input terminal 121.

A source of the third transistor 119, a source of a fourth NMOS transistor 131-1 and a source of a fifth NMOS transistor 131-2 are connected through a current source 133 to a source 135 of ground voltage ($V_G$). Gates of the fourth and fifth transistors, 131-1 and 131-2, receive a clock signal CLK/N (complementary to CLK/P) from a second clock terminal 122.

The first, second and third transistors, 111-1, 111-2 and 119, the first and second resistors, 115-1 and 115-2, the first and second input terminals, 113-1A and 113-2 and the first clock input terminal 121 are part of a data tracking module in the device 110.

A drain of the fifth transistor 131-2 is connected to sources of sixth and seventh NMOS transistors, 141-1 and 141-2. A drain of the fourth transistor 131-1 is connected to sources of eighth and ninth NMOS transistors, 143-1 and 143-2. Gates of the sixth and seventh transistors, 141-1 and 141-2, are connected to drains of the seventh transistor 141-2 and the sixth transistor 141-1, respectively. Drains of the first, sixth and ninth transistors, 111-1, 141-1 and 143-2, are connected to a gate of the seventh transistor 141-2 and to a first output signal terminal 137-1. Drains of the second, seventh and eighth transistors, 111-2, 141-2 and 143-1, are connected to a gate of the sixth transistor 141-1 and to a second output signal terminal 137-2.

Gates of the second and eighth transistors, 111-2 and 143-1, receive the input signal IN/N from the second input terminal 113-2. Gates of the first and ninth transistors, 111-1 and 143-2, receive the input signal IN/P from the first input terminal 113-1A and 113-1B.

The first, second and third transistors, 111-1, 111-2 and 119, the first and second resistors, 115-1 and 115-2, the first and second input terminals, 113-1A and 13-2, and the first clock input terminal 121 are part of a data tracking module in the device 110. The fourth, fifth, sixth, seventh, eighth and ninth transistors, 131-1, 131-2, 141-1, 141-2, 143-1 and 143-2, and the first and second data output terminals, 137-1 and 137-2, form part of a data latching module in the device 110.

Figure 6:
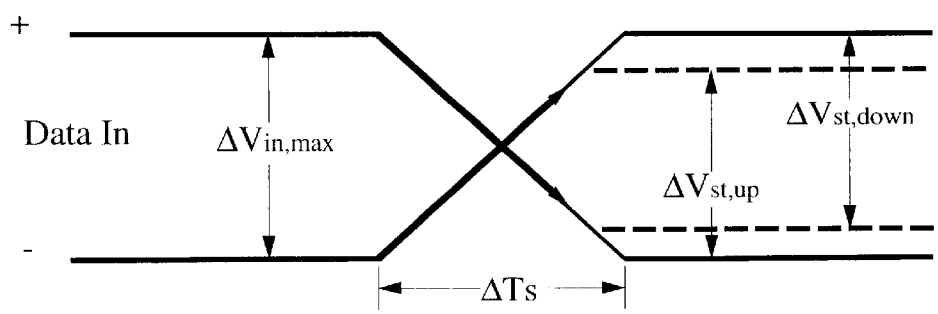
FIG. 6 graphically illustrates weakened tracking and latching.

Inclusion of the eighth and ninth transistors, 143-1 and 143-2, whose gates receive the respective input signals IN/P and IN/N, in the latch module provides weakened tracking through (1) connection of the drains of the seventh and eighth transistors, 141-2 and 143-1, to the gate of the sixth transistor 141-1 and (2) connection of the drains of the sixth and ninth transistors, 141-1 and 143-2, to the gate of the seventh transistor 141-2 When data are sampled at a clock transition point, the latch may experience initial metastability. However, as the (sampled) data approaches and resolves a valid logical state, the weak tracking mechanism can still moderate the output, which has just been sampled, by an amount (Gain)$\Delta V_{in.max}$ (>$\Delta V_{meta}$). This arrangement guarantees that the sampled data value will become stable, and thus avoid or move out of a metastable state at some time point. With reference to FIG. 6: (1) an upward data transition reaches an effective stability voltage value $\Delta V_{st}$(upward), after a time interval, indicated as $\Delta T_s$; and (2) a downward data transition reaches an effective stability voltage value $\Delta V_{st}$(downward) after a time interval, indicated as $\Delta T_s$.

The system 110 shown in FIG. 5 incorporates weakened tracking by inclusion of two tracking transistors, 143-1 and 143-2, in the latch module. Another embodiment 210 of a weak tracking system, shown in FIG. 7, does not use additional tracking transistors associated with the latch module but provides a bleeding current in a tracking transistor 219, or does not completely turn off (or completely turn on) the current in the transistor 219. This modification converts a the normal tracking transistor into a weak tracking transistor whose interference with the action of the latching transistors is reduced or eliminated. One method of implementing this modification is to require a higher saturation current for fill turn-on of the tracking transistor 219 than saturation current for a corresponding latching transistor 231 in FIG. 7.

Figure 7:
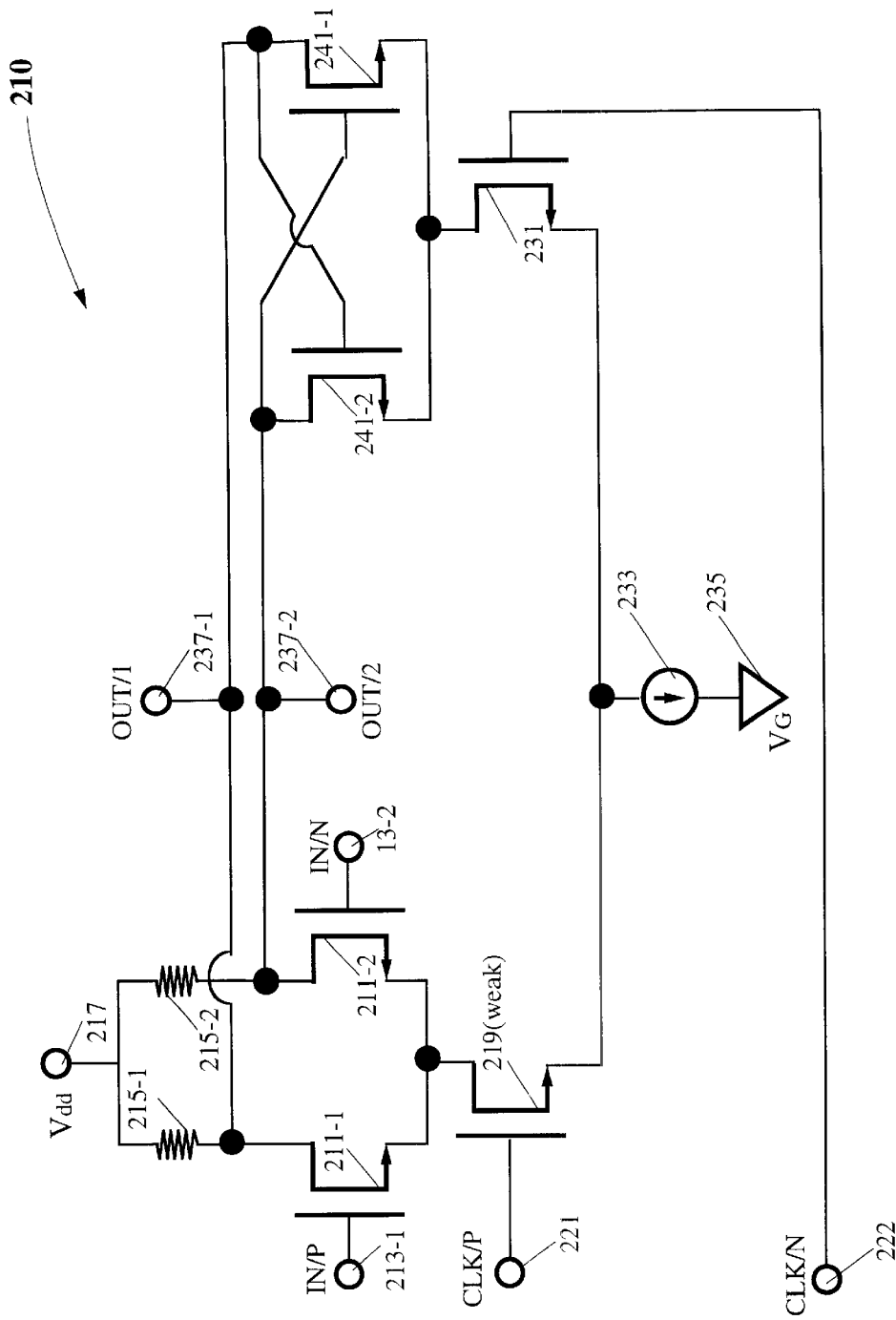

Although the transistors used to illustrate the circuits in FIGS. 1, 5 and 7 are NMOS transistors, these transistors can be replaced by PMOS transistors, which respond more slowly to a change of state at a transistor gate, with appropriate changes in signal polarity.

What is claimed is:
1. A data sampling circuit comprising:
 a data tracking circuit that receives a data signal, representing a sampled data value, at a data input transistor at a first sequence of one or more data sampling times and that receives a clock signal at a first clock input transistor at a second sequence of one or more selected times;
 a data latching circuit that receives the sampled data value from the data tracking circuit, that receives the clock signal at the second sequence of times at a second clock input transistor that has a first state and a second state, and, in response thereto, that provides a data output signal;
 wherein the first clock input transistor is weaker by a selected amount than the second clock input transistor so that the data latching circuit cannot manifest metastability when a voltage associated with the second clock input transistor moves beyond a selected voltage value in a transition from the first state to the second state.
2. A data sampling system comprising:
 a data tracking circuit comprising first and second MOS transistors, connected at their sources to a drain of a third MOS transistor, wherein gates of the first and second transistors receive first and second data input signals and a gate of the third transistor receives a first clock input signal, and wherein drains of the first and second transistors provide first and second output signals and are indirectly connected to a selected voltage source;
 a data latching circuit comprising fourth, fifth, sixth, seventh, eighth and ninth MOS transistors, wherein:
  gates of the fourth and fifth transistors receive a second clock input signal complementary to the first clock signal;
  sources of the third, fourth and fifth transistors are connected to a selected current source;

a drain of the fourth transistor is connected to sources of the eighth and ninth transistors;

a drain of the fifth transistor is connected to sources of the sixth and seventh transistors;

drains of the first, sixth and ninth transistors are connected to a gate of the seventh transistor and to a first output terminal; and drains of the second, seventh and eighth transistors are connected to a gate of the sixth transistor and to a second output terminal.

3. The system of claim 2, wherein at least one of said first, second, third, fourth, fifth, sixth, seventh, eighth and ninth transistors is an NMOS transistor.

4. The system of claim 2, wherein at least one of said first, second, third, fourth, fifth, sixth, seventh, eighth and ninth transistors is a PMOS transistor.

5. A data sampling system comprising:

a data tracking circuit comprising first and second MOS transistors, connected at their sources to a drain of a third MOS transistor, wherein gates of the first and second transistors receive first and second data input signals and a gate of the third transistor receives a first clock input signal, and wherein drains of the first and second transistors provide first and second output signals and are indirectly connected to a selected voltage source;

a data latching circuit comprising fourth, fifth and sixth MOS transistors, wherein:

sources of the third and fourth transistors are connected together and connected to a selected current source;

a drain of the fifth transistor and a gate of the sixth transistor are connected to the drain of the second transistor;

a drain of the sixth transistor and a gate of the fifth transistor are connected to the drain of the first transistor;

a gate of the fourth transistor receives a second clock input signal, complementary to the first clock signal; and sources of the fifth and sixth transistors are connected to a drain of the fourth transistor; and wherein current associated with the third transistor is weakened relative to current associated with the fourth transistor.

6. The system of claim 5, wherein at least one of said first, second, third, fourth, fifth and sixth transistors is an NMOS transistor.

7. The system of claim 5, wherein at least one of said first, second, third, fourth, fifth and sixth transistors is a PMOS transistor.

* * * * *